US007972159B2

United States Patent
Chen et al.

(10) Patent No.: US 7,972,159 B2
(45) Date of Patent: Jul. 5, 2011

(54) ELECTRICAL CONNECTOR FOR TEST SOCKET

(75) Inventors: Ming-Yue Chen, Tu-Cheng (TW); Shih-Wei Hsiao, Tu-Cheng (TW); Ke-Hao Chen, Tu-Cheng (TW); Wen-Yi Hsieh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 11 days.

(21) Appl. No.: 12/547,500

(22) Filed: Aug. 26, 2009

(65) Prior Publication Data

US 2010/0055936 A1    Mar. 4, 2010

(30) Foreign Application Priority Data

Aug. 26, 2008  (TW) ................................. 097132449
Sep. 1, 2008  (TW) ................................. 097133393

(51) Int. Cl.
  *H01R 11/22*  (2006.01)
(52) U.S. Cl. ........................................ 439/266; 439/342
(58) Field of Classification Search .................. 439/266, 439/342, 343
See application file for complete search history.

(56) References Cited

U.S. PATENT DOCUMENTS

| 6,322,383 | B1 | 11/2001 | Itabashi et al. |
| RE39,418 | E * | 12/2006 | Pfaff ............................. 439/266 |
| 2001/0021601 | A1* | 9/2001 | Fukunaga .................... 439/266 |

FOREIGN PATENT DOCUMENTS

| CN | 201029137 | 2/2008 |
| JP | 2004-71256 A | 3/2004 |
| TW | I294709 | 3/2008 |

\* cited by examiner

*Primary Examiner* — Ross N Gushi
(74) *Attorney, Agent, or Firm* — Andrew C. Cheng; Wei Te Chung; Ming Chieh Chang

(57) ABSTRACT

An electrical connector (100) for electrically connecting a Central Processing Unit (CPU) with a Printed Circuit Board (PCB), includes a base (2), a plurality of insulative layers (34), a plurality of contacts (4) and a plurality of cams (33). The base defines a cavity (21) and the insulative layers are stacked and received in the cavity. The insulative layers define a plurality of passageways therein. The contacts are received in the passageways of the insulative layers. The cams are rotatable around to push different insulative layers to have different degrees of movement in a predetermined direction.

12 Claims, 9 Drawing Sheets

ELECTRICAL CONNECTOR FOR TEST SOCKET

BACKGROUND OF THE INVENTION

1. Field of the Invention

The present invention relates generally to an electrical connector, and more particularly to an electrical connector for connecting a Central Processing Unit (CPU) with a Printed Circuit Board (PCB) during a test procedure for the CPU.

2. Description of Related Arts

An electrical connector used for connecting the CPU with the PCB, especially in a test procedure for the CPU, mainly comprises an insulative housing, a plurality of contacts received in the insulative housing for electrically connecting electrical pads of the CPU with circuit pads of the PCB and a cover for activating the CPU to connect with the contacts. The contacts are usually curved to have flexible deflection. Accordingly, the insulative housing has larger passageways to receive the contacts.

Referring to FIG. 1 of a cross-section view of an electrical connector as a first prior art, the electrical connector is connected with a CPU 12 by a plurality of solder balls 120. The electrical connector comprises an insulative housing (not labeled) and a plurality of contacts 10 received in the insulative housing. The insulative housing forms an immovable layer 14 in an upper level and a moveable layer 16 in a lower level, keeping in a distance away from the immovable layer 14. The immovable layer 14 is closer to the CPU than the moveable layer 16. Each contact 10 comprises a contact portion 100 connecting with the CPU by the solder balls 120, a rear portion 104 inserted into a PCB and a connecting portion (not labeled) connecting the contact portion 100 with the rear portion 104. The connecting portions have no isolating member such as an insulative housing arranged therebetween. Under a development of the computer technology, a supper fast data operation of the computer requires a supper fast data operation of the CPU, which causes a high density of the pins of the CPU. The contacts of the electrical connector connecting with the CPU result in a high density too. The connecting portions of the adjacent contacts are easy to be interfered with each other, more seriously, may cause shorting risk, because there is no isolating member such as insulative housing arranged therebetween.

Continue to refer to FIG. 2 of a cross-section view of an electrical connector as a second prior art, the electrical connector is connected with a CPU 22 by a plurality of solder balls 24 too, the same as the electrical connector of the first prior art. The electrical connector comprises an insulative housing 25 and a plurality of contacts 20. The insulative housing 25 defines a plurality of passageways 27 for receiving the contacts 20, therefore, each contact 20 is separated from the adjacent contact 20 by the insulative housing 25. Interference between the contacts 20 is avoided. Each contact 20 comprises a contact portion 200 connecting with the solder ball 24, a rear portion 204 inserted into a PCB and a curved connecting portion 202 connecting the contact portion 200 with the rear portion 204. The contact 20 is deflected in the passageway 27 when the CPU presses against the electrical connector, and an electrical connection between the contact portions 200 of the contacts 20 and the solder balls 24 are achieved. However, according to a high density of pins of the CPU, the passageways 27 receiving the contacts 20 are smaller. It provides limitation to a deflection of the contacts 20. Therefore, the electrical connection between the contact portions 200 of the contacts 20 and the solder balls 24 is influenced. The insulative housing 25 is made from rigid material, thus the contact 20 interferes with or even scraps the lateral walls of the insulative housing 25 when the contact 20 is pressed to deflect in the passageway 27. It may cause a lot of chips scrapped from the lateral walls of the insulative housing. The chips fall into the inner side of the electrical connector and influence a performance of the electrical connector. Furthermore, the insulative housing 25 has poor heat emitting ability. It will accumulate a lot of heat therein when the electrical connector works. It may cause deadly destroy to the electrical connector.

Hence, an improved electrical connector preventing interference between the adjacent contacts, having small space between the contacts but the contacts thereof having fine flexibility is desired.

SUMMARY OF THE INVENTION

Accordingly, an object of the present invention is to provide an electrical connector preventing interference between the adjacent contacts, having small space between the contacts but the contacts thereof having fine flexibility is desired.

To achieve the above object, an electrical connector for electrically connecting a Central Processing Unit (CPU) with a Printed Circuit Board (PCB), includes a base, a plurality of insulative layers, a plurality of contacts and a plurality of cams. The base defines a cavity and the insulative layers are stacked and received in the cavity. The insulative layers define a plurality of passageways therein. The contacts are received in the passageways of the insulative layers. The cams are rotatable around to push different insulative layers to have different degrees of movement in a predetermined direction.

Other objects, advantages and novel features of the invention will become more apparent from the following detailed description when taken in conjunction with the accompanying drawings.

DETAILED DESCRIPTION OF THE PREFERRED EMBODIMENT

Figure 1:
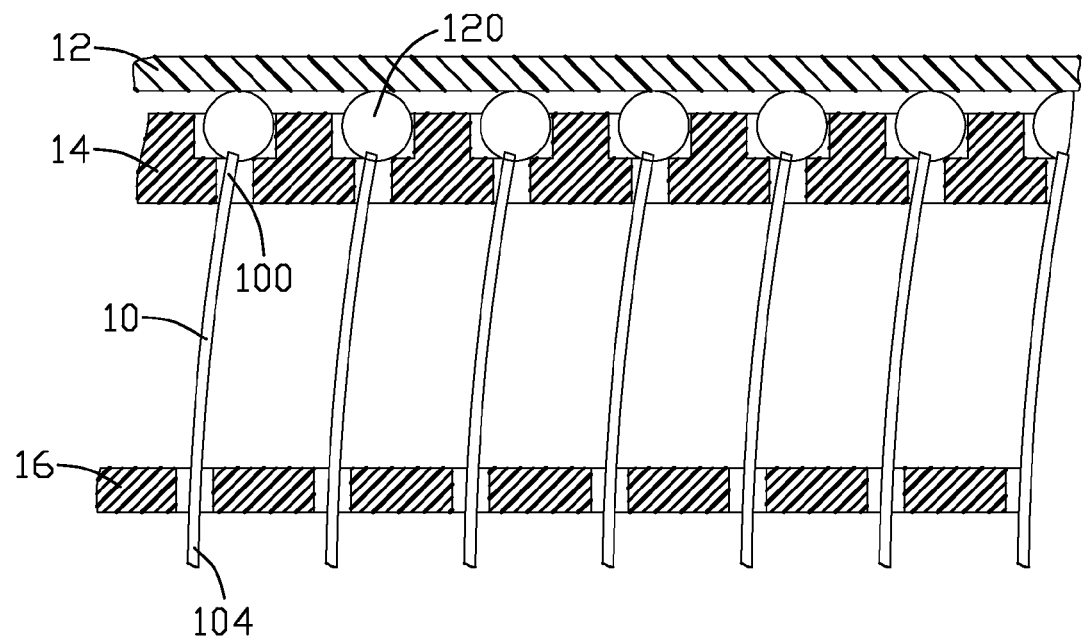
FIG. 1 is a cross-section view of an electrical connector as a first prior art.
Figure 2:
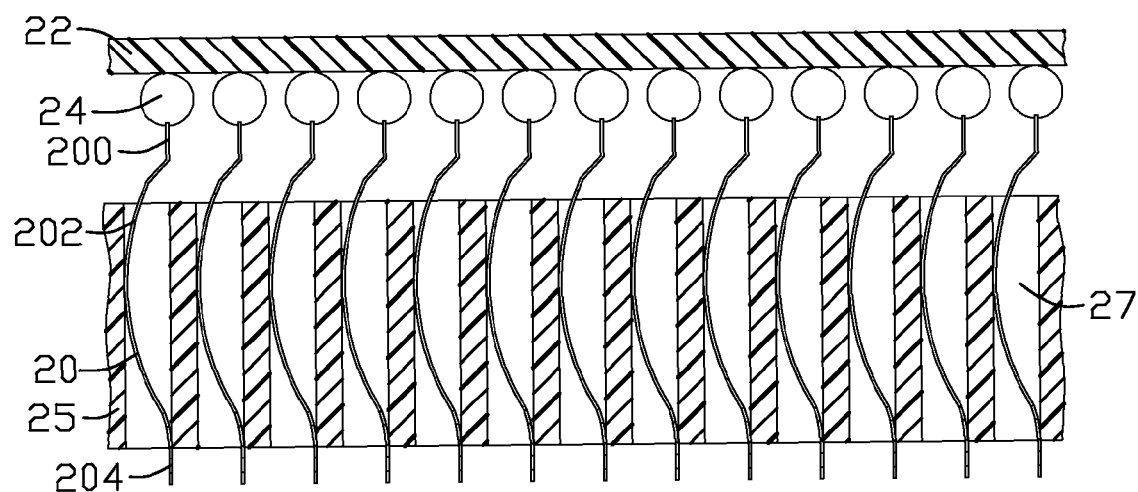
FIG. 2 is another cross-section view of an electrical connector as a second prior art.
Figure 3:
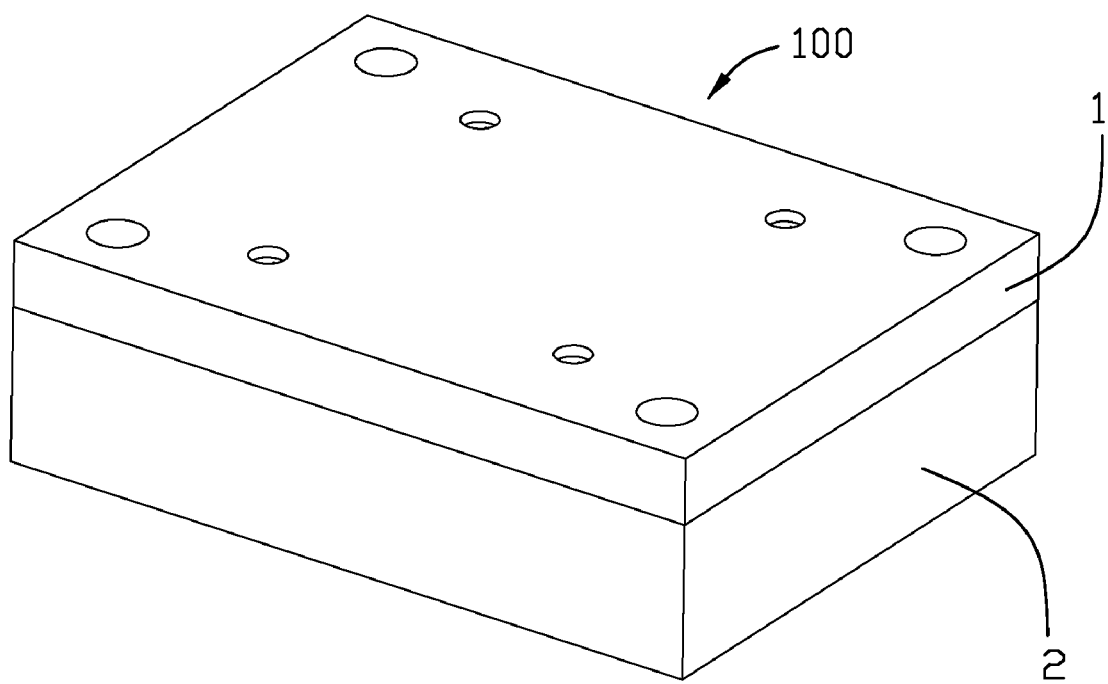
FIG. 3 is a perspective, assembled view of an electrical connector according to the present invention.
Figure 4:
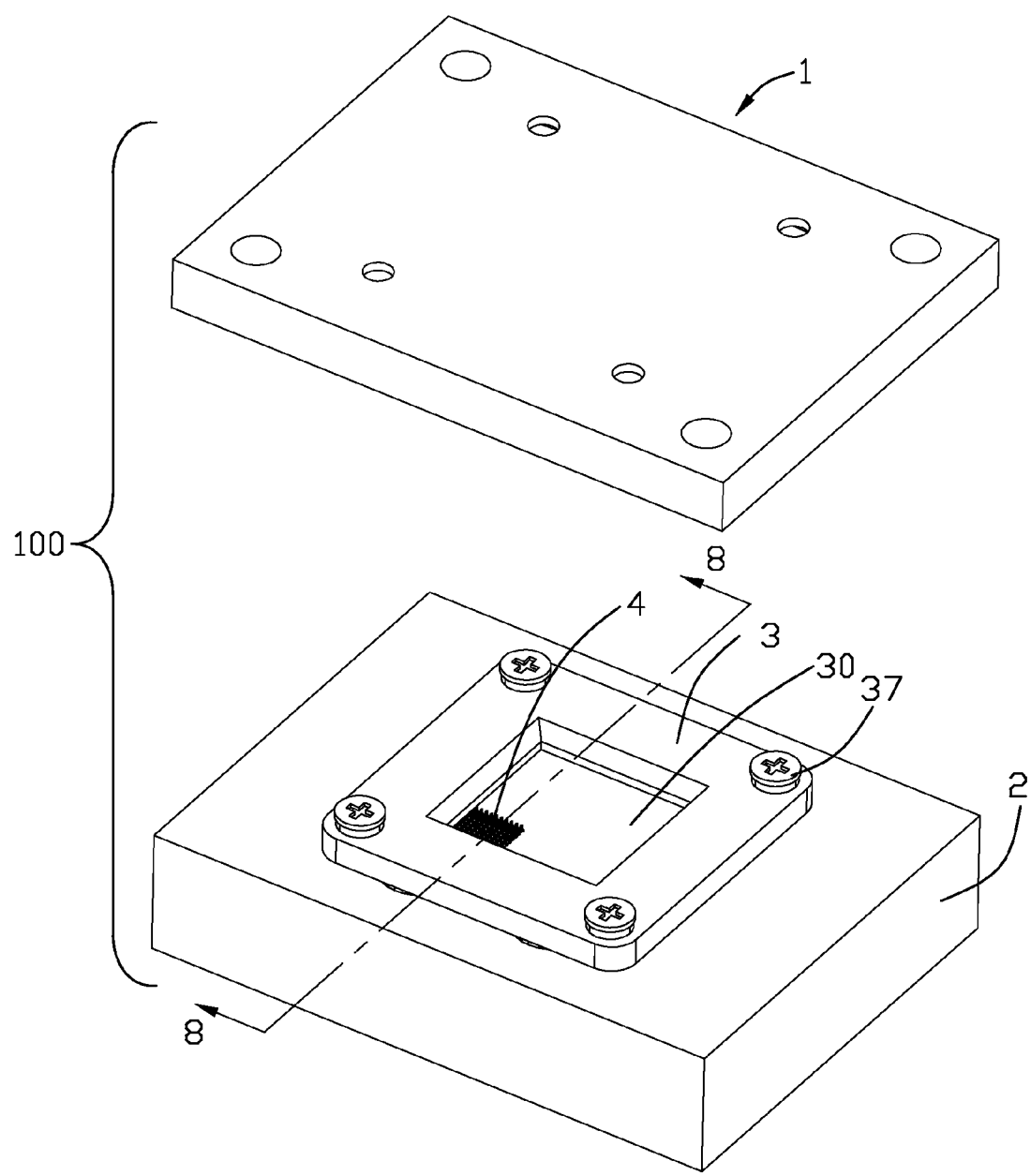
FIG. 4 is another perspective view of the electrical connector in which a cover is separated from the router and the base.

Referring to FIGS. 3 and 4, an electrical connector 100 in accordance with the present invention, used for connecting a Central Processing Unit (CPU) (not shown) with a printed circuit board (PCB) (not shown) to transmit signals therebetween, comprises a base 2, a router 3 received in the base 2, a plurality of contacts 4 assembled in the router 3 with two distal ends thereof extending out of the router 3 and a cover 1 pressing against the base 2. The router 3 defines a cutout 30 for the CPU in an upper face thereof. The cover 1 presses against the CPU too when it presses against the base 2 to activate an electrical contact between the CPU and the contacts 4.

Figure 7:
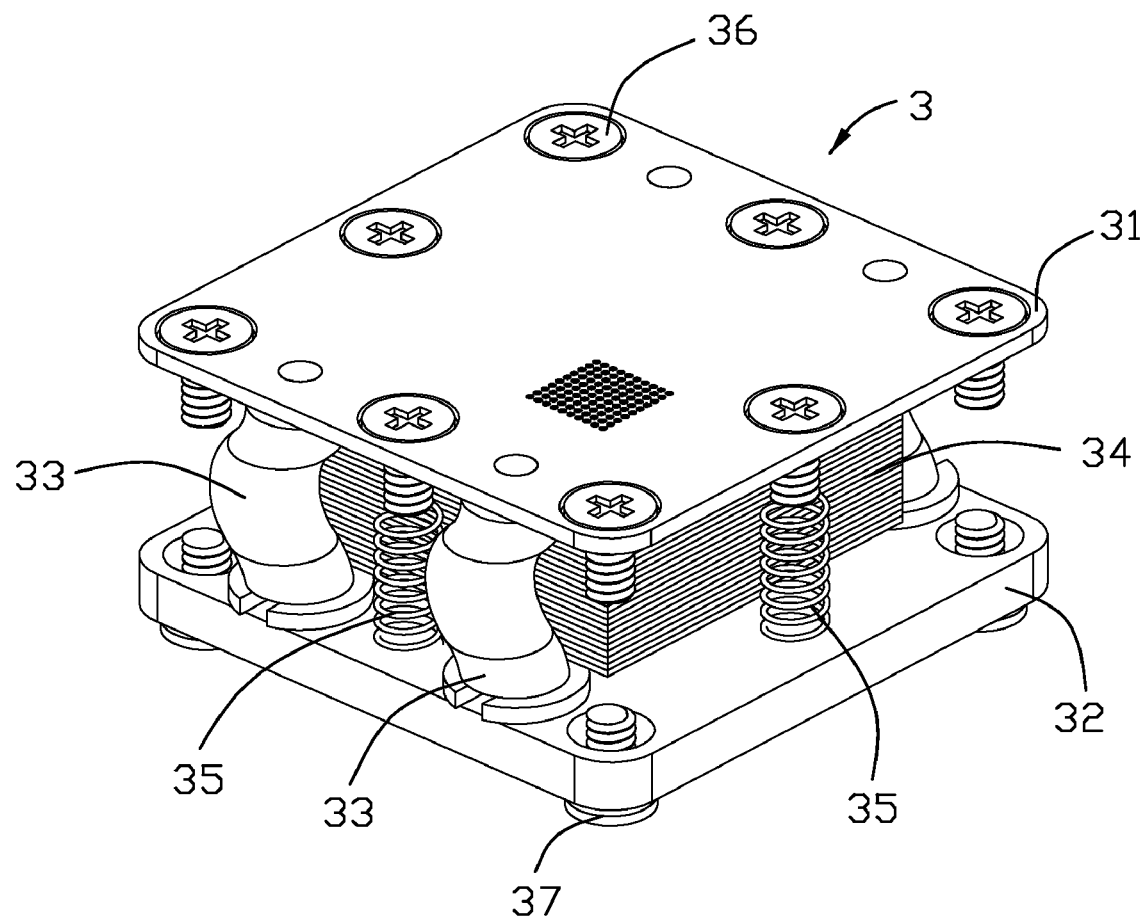
FIG. 7 is a perspective view of the router separated from the cover and the base.
Figure 8:
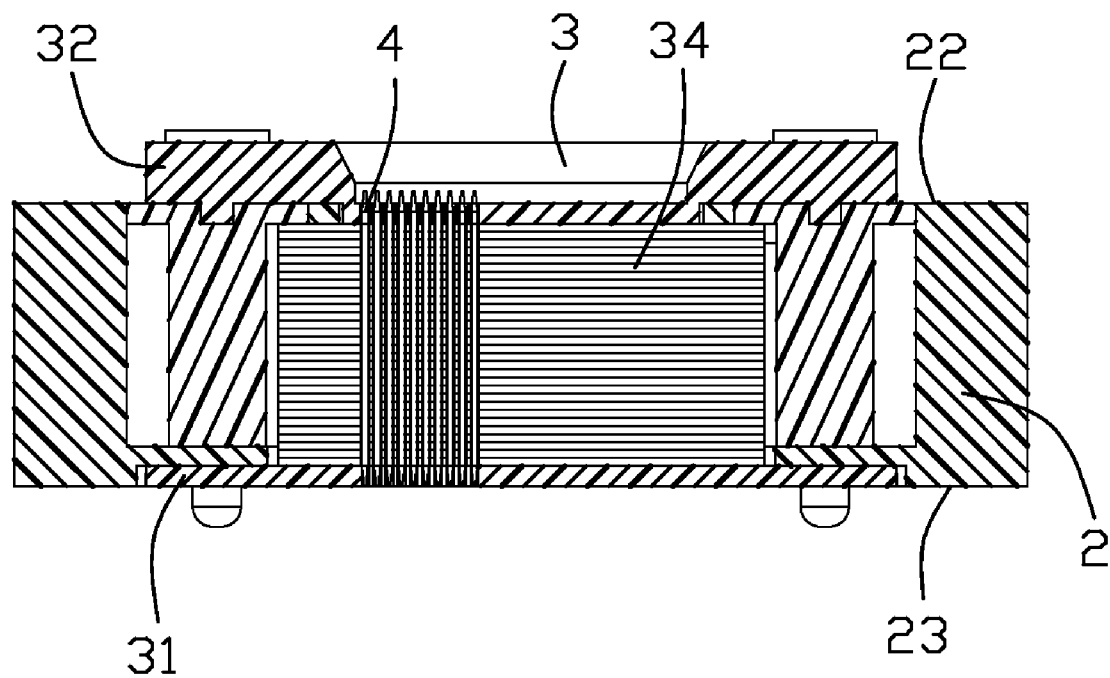
FIG. 8 is a cross-section view taken along line 8-8 of FIG. 4 without the cover when the contacts are straight.
Figure 9:
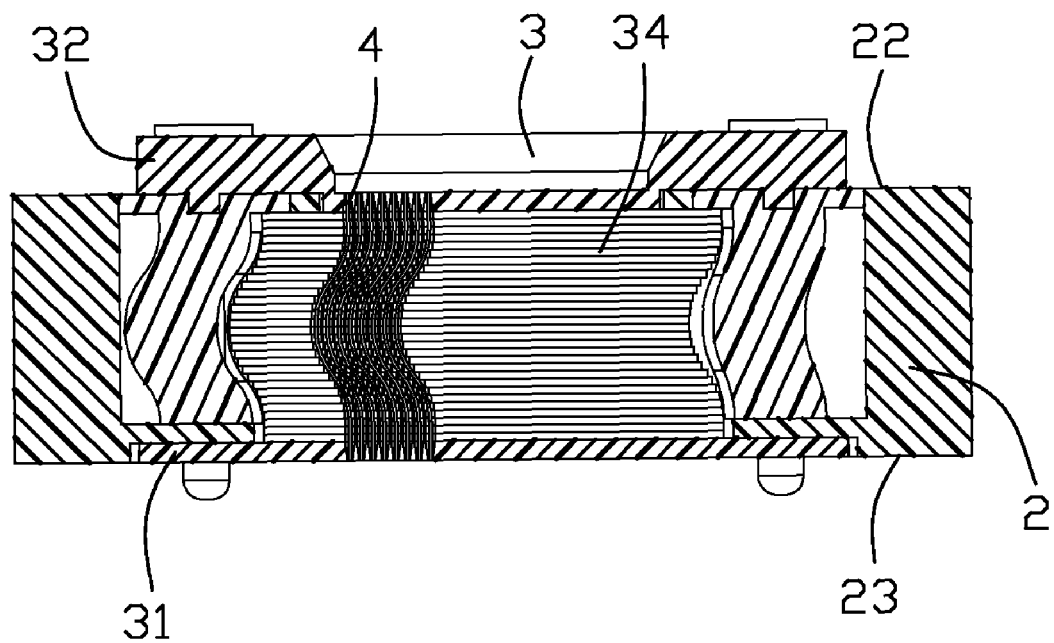
FIG. 9 is a cross-section view without the cover when the contacts are curved.

Referring to FIG. 7, the router 3 comprises a positioning piece 31 for assembling onto the PCB, a holding piece 32 defining the cutout 30 for receiving the CPU, a plurality of insulative layers 34 stacked between the positioning piece 31 and the holding piece 32 and a plurality of cams 33 located beside the insulative layers 34 for connecting the positioning piece 31 with the holding piece 32. The cams 33 are rotatable around by screwdriver to push different insulative layers 34 to have different degrees of movement. The positioning piece 31 and the holding piece 32 are both square shaped with four corners thereof. Each insulative layer 34 is square shaped which has a smaller size than the positioning piece 31 and the holding piece 32. The insulative layers 34 are made from aluminum in an anodizing process in a preferred embodiment, which has better flexibility and better heat emission. However, it is not limiting, the insulative layers 34 can also be made from other metal materials in an anodizing process for instead. Each insulative layer 34 defines a plurality of passageways for receiving the contacts 4 while the positioning piece 31 and the holding piece 32 define corresponding passageways for the contacts 4 going through too. The contacts 4 can extend out of the positioning piece 31 and the holding piece 32 for respectively connecting with the CPU and the PCB. The holding piece 32 forms a locking portion 37 at each corner thereof and an elastic portion 35 at each edge thereof. In a preferred embodiment, the locking portion 37 is a screw bolt and the elastic portion 35 is a spring. The positioning piece 31 forms a plurality of screwing portions 36 at the edges thereof.

Figure 5:
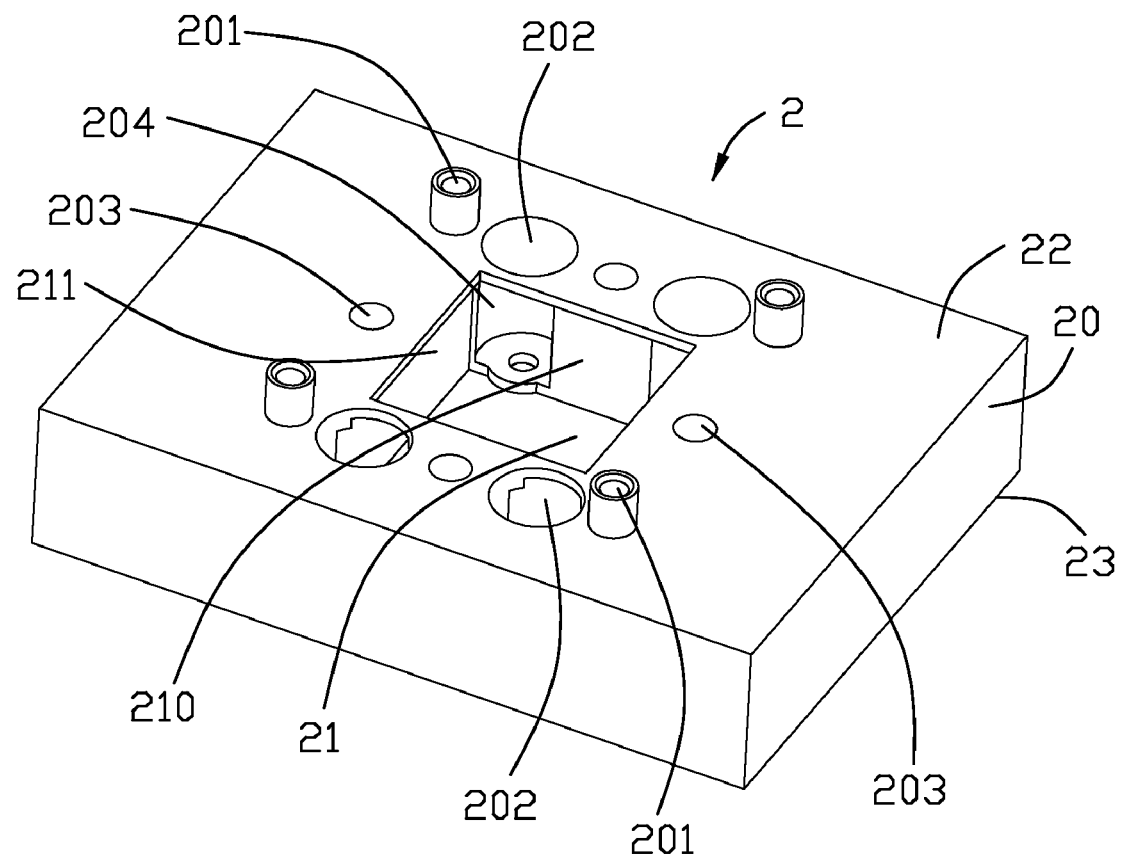
FIG. 5 is a perspective view of the base of the electrical connector.
Figure 6:
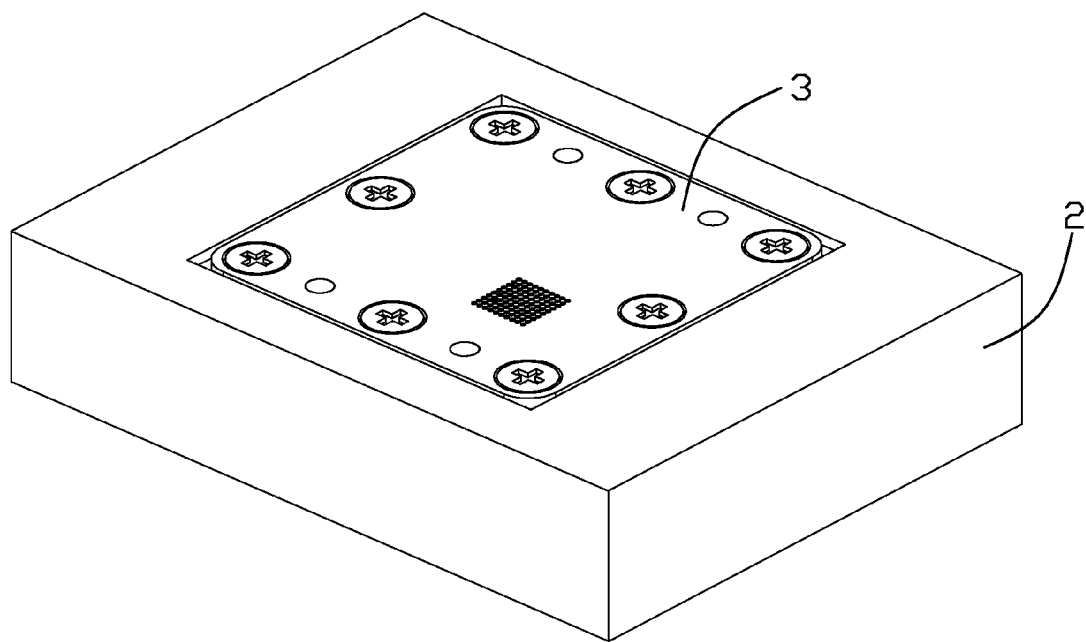
FIG. 6 is a perspective view of the electrical connector without the cover.

As is indicated in FIGS. 5, the base 2 is rectangular shaped and made of insulative material. The base 2 comprises a main portion 20 and defines a cavity 21 in the middle of the main portion 20 for receiving said insulative layers 34 of the router 3. The cavity 21 of the base 2 is just located below the cutout 30 of the router 3 when the router 3 is assembled on the base 2, therefore, the contacts 4 arranged in the cavity 21 is located below the CPU received in the cutout 30. The main portion 20 comprises an upper surface 22 and a lower surface 23, the upper surface 22 mated with the holding piece 32 of the router 3 while the lower surface 23 mated with the positioning piece 31 of the router 3. The cavity 21 defines a pair of first lateral walls 210 facing towards each other and a pair of second lateral walls 211 facing towards each other for connecting with the first lateral walls 210. The first lateral wall 210 has a similar length to the transverse edge of the insulative layer 34 and the second lateral wall 211 has a length larger than the lengthwise edge of the insulative layer 34 that the insulative layer 34 is moveable from one of the first lateral walls 210 towards the other along the second lateral walls 211. The lower surface 23 defines a plurality of screwing holes (not shown) for receiving the screwing portions 36. The upper surface 22 forms a plurality of hollow columns 201 mated with the locking portions 37 and defines a slot 203 between each two hollow columns 201 for receiving the elastic portions 35. The base 2 defines a pair of channels 202 respectively at two sides of the slots 203 beside the first lateral walls 210. The first lateral walls 210 defines a plurality of openings 204 for communication between the channels 202 and the cavity 21. The cam 33 is received in the channel 202, rotatable therein and protrudes into the cavity 21 throughout the opening 204.

An assembling process is described as following: the positioning piece 31 is attached to the lower surface 23 of the base 2 by the screwing portions 36, the cams 33 are rotatably received in the channels 202 of the base 2. The insulative layers 34 are stacked in the cavity 21 of the base 2 and limited therein by the first and second lateral walls 210, 211 together with the cams 33. Each passageway defined on each insulative layer 34 keeps in alignment with the corresponding passageways defined on other insulative layers 34, the positioning piece 31 and the holding piece 32. Thereafter, the preformed and linear contacts 4 are inserted into the passageways of the insulative layers 34 easily and at the beginning, received in the positioning piece 31 but not extend out of the holding piece 32. The contacts 4 connect with the CPU in a manner of BGA and connect with the PCB in a manner of PGA. Since the contacts 4 are metal and linear ones with small flexibility it results in a bad connection between the contacts 4 and the solder balls below the CPU.

Therefore, the insulative layers 34 are driven to move along in different degrees when the cams 33 are synchronously rotated, since the cams 33 have curved configuration, the cams 33 protrude into the cavity throughout the openings 204 in different degrees taken from a top view. Thereby, the contacts 4 are curved due to the different movement of the insulative layers 34 however no limitation by the passageways of the insulative layers 34. Therefore, the contacts 4 have large flexibility to achieve a good connection with the CPU. Since the contacts 4 are separated from each other by insulative materials that the contacts 4 avoid interference easily. Since the passageways defined in the insulative layers 34 are designed at appropriate sizes for just fitly receiving the contacts 4, the contacts 4 can be arranged close enough to suit with the high density of the pins of the CPU. Additionally, the insulative pieces 34 are made from aluminum in an anodizing process, which is flexible, the insulative layers 34 prevent a lot of chips scrapped therefrom when the contacts 4 are curved and so prevent destroy to the electrical connector. The insulative layers 34 emit the heat timely since aluminum has better heat emission. In the end, the holding piece 32 is attached to the upper surface 22 of the base 2 by the locking portions 37 limited in the hollow columns 201 and floatably supported upon the base 2 due to the elastic portions 201. The CPU is received in the cutout 30 of the router 3 and the cover 1 presses against the CPU to activate an electrical contact between the CPU and the contacts 4.

Another embodiment of the present invention is described as following: the contacts 4 are preformed to be curved, however, the contacts 4 are pressed to be straight to be easily inserted into the passageways of the insulative layers 34. Thereafter, the contacts 4 return back to the curved figure and drive the different insulative layers 34 to move in different degrees. During the movement of the insulative layers 34, the cams 33 are driven to rotate around. In this embodiment, the cams 33 are just used for limitation to the insulative layers 34 together with the first and second lateral walls 210, 211. The cams 33 are removable from the electrical connector 100 for releasing room for the insulative layers 34.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector for electrically connecting a Central Processing Unit (CPU) with a Printed Circuit Board (PCB), comprising:

a base defining a cavity and a plurality of channels, the cavity defining a pair of first lateral walls facing towards each other and a pair of second lateral walls facing towards each other for connecting with the first lateral walls;

a plurality of insulative layers stacked and received in the cavity, each defining a plurality of passageways therein;

a plurality of contacts received in the passageways of the insulative layers; and a plurality of cams received in and rotatable in the corresponding channels to push different insulative layers to have different degrees of movement in a predetermined direction; wherein the first lateral walls define a plurality of openings communicating the channels with the cavity and the cams protrude into the cavity throughout the openings.

2. The electrical connector as described in claim 1, further comprising a holding piece attached to an upper surface of the base and defining a cutout in the middle thereof for receiving the CPU.

3. The electrical connector as described in claim 2, wherein the holding piece forms a plurality of elastic portions, the base defines a plurality of slots to receive the elastic portions and the holding piece is floatably supported upon the base due to the elastic portions.

4. The electrical connector as described in claim 3, wherein the holding piece defines a plurality of passageways for receiving the contacts and the contacts extend through the passageways to connect the CPU in use.

5. The electrical connector as described in claim 1, further comprising a positioning piece located below the base and the contacts extend out of the positioning piece for electrical connection with the PCB.

6. The electrical connector as described in claim 1, wherein the insulative layers are made from aluminum in an anodizing process.

7. The electrical connector as described in claim 1, wherein the contacts are preformed to be straight ones, inserted into the passageways of the insulative layers and then curved due to the different degrees of movement of the insulative layers.

8. The electrical connector as described in claim 1, further comprising a cover pressing against the base to activate an electrical contact between the CPU and the PCB.

9. An electrical connector for electrically connecting a Central Processing Unit (CPU) with a Printed Circuit Board (PCB), comprising:

a base defining a cavity;

a plurality of insulative layers stacked and received in the cavity, each defining a plurality of passageways therein; and a plurality of contacts received in the passageways of the insulative layers;

wherein the contacts are curved and have elasticity to push different insulative layers to have different degrees of movement in a predetermined direction; and wherein the contacts are preformed to be curved ones, but pressed to be straight ones into the passageways of the insulative layers and then return back to the curved figure.

10. An electrical connector comprising:

an insulative housing formed by a plurality of insulative layers stacked with one another in a vertical direction; and an array of conductive contacts extending through said insulative layers in said vertical direction under condition that the contacts are transversely snugly, intimately and compliantly engaged with said insulative layers; wherein each of said contacts defines a curved shape in a middle portion in said vertical direction, and the electrical connector further includes at least one cam structure engaging a lateral side of the insulative layers to comply with the curved shape of said contact.

11. The electrical connector as claimed in claim 10, wherein said contacts are of a relaxed manner when said contacts extend straight in said vertical direction.

12. The electrical connector as claimed in claim 10, wherein each of said insulative layers defines an array of passageways receiving the corresponding contacts, respectively.

* * * * *